United States Patent [19]
Menard et al.

[11] Patent Number: 5,828,501
[45] Date of Patent: Oct. 27, 1998

[54] APPARATUS AND METHOD FOR POSITIONING A LENS TO EXPAND AN OPTICAL BEAM OF AN IMAGING SYSTEM

[75] Inventors: Alan W. Menard, Bolton; David P. Squires, Lebanon; Gene D. Welti, Ellington; Joseph A. Wheeler, Vernon, all of Conn.

[73] Assignee: Barco Gerber Systems, South Windsor, Conn.

[21] Appl. No.: 674,439

[22] Filed: Jul. 2, 1996

[51] Int. Cl.⁶ .............................. G02B 7/02; G11B 17/00
[52] U.S. Cl. ............................................. 359/819; 369/249
[58] Field of Search .................... 359/814, 819, 359/809, 823, 824; 347/164, 262, 264; 346/134, 136; 364/550, 551.01, 525, 176, 167.01; 358/474, 480, 481, 487, 488, 489, 490, 491, 493, 494, 495, 497

[56] References Cited

U.S. PATENT DOCUMENTS

| | | | |
|---|---|---|---|
| 3,272,568 | 9/1966 | Koorneef et al. | 305/5 |
| 3,816,659 | 6/1974 | Landsman | 178/7.6 |
| 3,857,031 | 12/1974 | Sinclair et al. | 250/201 |
| 3,894,276 | 7/1975 | Janssen | 318/135 |
| 3,938,191 | 2/1976 | Jarmy | 360/102 |
| 4,012,676 | 3/1977 | Giebler | 318/135 |
| 4,028,732 | 6/1977 | Salter et al. | 358/289 |
| 4,131,916 | 12/1978 | Landsman | 358/285 |
| 4,186,991 | 2/1980 | Koide et al. | 350/6.91 |
| 4,209,239 | 6/1980 | Wood et al. | 354/4 |
| 4,387,452 | 6/1983 | Bricot et al. | 369/32 |
| 4,402,061 | 8/1983 | Haz et al. | 365/127 |
| 4,409,624 | 10/1983 | Kingsley | 358/285 |

(List continued on next page.)

FOREIGN PATENT DOCUMENTS

| | | |
|---|---|---|
| 0 052 346 | 11/1981 | European Pat. Off. . |
| 30 14 409 | 10/1980 | Germany . |
| 44 11 574 | 5/1995 | Germany . |
| 2 049 300 | 12/1980 | United Kingdom . |

OTHER PUBLICATIONS

"Linear Motor Applications" by Boaz Eidelberg, Anorad Corp., Oct. 1992, 4 sheets.
"Air Bearings, Technology & Applications" by Robert Kody, Dover Instrument Corporation, Nov./Dec. 1992 3 sheets.
"Accuracy in Positioning Systems" by Kevin McCarthy, New England Affiliated Technologies, 15 sheets, Mar. 19, 1991.
Literature re Trilogy, 1994.
Literature re Linear Motor Applications Note, New England Affiliated Technologies, 6 sheets, Jul. 20, 1995.
"The Amateur Scientist" by Shawn Carlson, Scientific American, Aug. 1996, pp. 96, 98–99.

*Primary Examiner*—Frank G. Font
*Assistant Examiner*—Michael P. Stafira
*Attorney, Agent, or Firm*—McCormick, Paulding & Huber

[57] ABSTRACT

An optical beam expander mechanism includes a plurality of lenses movably secured to a carriage of an imaging system for varying the magnification and adjusting the focus of an optical beam. A scanning means is also secured to the carriage for reflecting the optical beam from or to a media disposed within an exposure chamber. The carriage is slidably mounted to a spar for scanning the media as the carriage moves along the length of the spar. The carriage includes a plurality of independently controlled magnetically preloaded air bearings to provide an air cushion for frictionless movement of the lens along the carriage. The beam expander mechanism further includes an arm member which sequentially engages each lens and maintains the lens in fixed relationship to the spar for positioning the lens on the carriage. To move each lens to its proper position on the carriage, the arm member engages the lens. The corresponding air bearing is actuated to permit movement of the lens while the carriage is commanded to move a predetermined distance for the required magnification and focus of the optical beam. The air bearing is then deactuated to magnetically couple the lens to the carriage at its proper position. The arm member then disengages the lens.

30 Claims, 9 Drawing Sheets

U.S. PATENT DOCUMENTS

| | | | |
|---|---|---|---|
| 4,413,863 | 11/1983 | Lombard | 308/5 R |
| 4,415,911 | 11/1983 | Tazaki | 346/140 |
| 4,417,330 | 11/1983 | Hazel et al. | 369/32 |
| 4,432,082 | 2/1984 | Hsieh et al. | 369/32 |
| 4,432,083 | 2/1984 | Hsieh et al. | 369/44 |
| 4,435,797 | 3/1984 | Hsieh et al. | 369/32 |
| 4,443,870 | 4/1984 | Hazel et al. | 369/44 |
| 4,445,798 | 5/1984 | Munehiro | 400/320 |
| 4,455,910 | 6/1984 | Kraft et al. | 83/874 |
| 4,476,496 | 10/1984 | Thaler | 358/286 |
| 4,489,406 | 12/1984 | Hsieh et al. | 369/32 |
| 4,494,226 | 1/1985 | Hazel et al. | 369/45 |
| 4,543,615 | 9/1985 | Van Campenhout et al. | 358/285 |
| 4,585,331 | 4/1986 | Stoffel et al. | 355/8 |
| 4,631,432 | 12/1986 | Thaler | 310/14 |
| 4,666,315 | 5/1987 | Scranton | 384/1 |
| 4,704,712 | 11/1987 | Siryj | 369/249 |
| 4,798,478 | 1/1989 | Crystal | 384/12 |
| 4,834,353 | 5/1989 | Chitayat | 269/73 |
| 4,851,656 | 7/1989 | Straayer | 250/201 |
| 4,853,709 | 8/1989 | Stein et al. | 346/108 |
| 4,985,651 | 1/1991 | Chitayat | 310/12 |
| 5,098,203 | 3/1992 | Henderson | 384/12 |
| 5,228,358 | 7/1993 | Sakino et al. | 74/479 |
| 5,291,392 | 3/1994 | Gerber et al. | 364/167 |
| 5,387,995 | 2/1995 | Harig | 359/204 |
| 5,421,937 | 6/1995 | Menard et al. | 156/212 |
| 5,619,246 | 4/1997 | Straayer et al. | 347/262 |
| 5,623,372 | 4/1997 | Matsui | 359/814 |
| 5,640,473 | 6/1997 | Wheeler et al. | 385/27 |

APPARATUS AND METHOD FOR POSITIONING A LENS TO EXPAND AN OPTICAL BEAM OF AN IMAGING SYSTEM

FIELD OF THE INVENTION

This invention relates to imaging systems and more particularly to an apparatus and method for positioning a lens disposed on a carriage movably engaged to a spar for magnifying and focusing an optical feed beam of an imaging system.

CROSS REFERENCES TO RELATED APPLICATIONS AND PATENTS

Some of the matter contained herein is disclosed and claimed in the commonly owned U.S. patent application Ser. No. 08/674,763, entitled "Magnetically Preloaded Air Bearing Motion System for an Imaging Device" (Attorney Docket No. I48-1075) and U.S. patent application Ser. No. 08/674,766, entitled "A Method And Apparatus For Imaging At A Plurality Of Wavelengths" (Attorney Docket No. I48-1097) and U.S. patent application Ser. No. 08/677,343, entitled "Method And Apparatus For Generating An Optical Beam For Use In An Imaging System" (Attorney Docket No. I48-1100) incorporated herein by reference.

BACKGROUND OF THE INVENTION

Imaging devices of both planar, external drum and internal drum design, such as photoplotters and scanners, are known in the art. Scanners function by illuminating the test sample with an unmodulated optical beam and capturing the reflected or transmitted light after it leaves the copy. The transmitted or reflected optical signals are received by a detector and recorded.

Photoplotters are used in the field of graphic arts and the fabrication of printed circuit boards. Planar imaging systems such as are disclosed and claimed in U.S. Pat. No. 4,851,656 and incorporated herein by reference are types of imaging systems which have a planar surface for receiving a substrate or media. An optical exposure head is located on a movable gantry apparatus and is rastered above the media during exposure.

Internal drum devices have a cylindrical surface portion to receive the media. An optical beam generator emits a modulated optical feed beam onto a spinning mirror, and the mirror reflects the beam onto the media. As the mirror spins, the reflected imaging beam advances across the media surface from one side edge of the surface to an other side edge thereof, exposing a sequence of pixels which together form a scan line perpendicular to the axis of the drum. The spinning mirror is mounted on a carriage which moves along the axis of the drum, perpendicular to the scan line. The carriage moves continuously so that the imaging process is helical along the cylinder. The rotating imaging beam advances across the surface area of the drum in this manner until the entire image is exposed to the media.

The model Crescent 42 internal drum photo plotter presently manufactured by the assignee of the present invention, Gerber Scientific, Inc., includes a carriage having two surfaces, which constrain the carriage in two planes, magnetically coupled to a rigid spar that extends along the longitudinal axis of the drum. The carriage is suspended below the spar. A plurality of friction pads formed of polymeric material are secured to the orthogonal surfaces of the carriage for maintaining the carriage a predetermined distance from the spar. A spinner motor and mirror for reflecting the optical beam to the media is mounted to the under surface of the carriage.

The carriage is driven along the spar by a drive system comprising a lead screw and a stepper motor. A motor drive system energizes the stepper motor in minute increments to rotate the lead screw resulting in movement of the carriage along the spar. The motor drive system controls the stepper motor in an open loop mode.

The imaging system also includes a beam focusing assembly mounted to the fixed optical chassis or structure of the photoplotter for magnifying the optical beam passing therethrough. The focusing assembly has four discrete stages, each of which comprises a pair of lenses for focusing the beam at a predetermined magnification. A motor drive system selectively positions the approriate stage for the desired degree of magnification coaxially with the optical beam. Such a focusing assembly can be very complex, and therefore is costly to assembly and manufacture.

As is known in the art, air turbulence within the internal chamber effects the optical beam fed from the optical chassis to the spinning mirror disposed on the carriage resulting in images of poor quality and "banding" or longitudinal lines formed in the media. The greater the diameter of the optical feed beam, the greater the effect of the air turbulence to the optical beam. Therefore, it is desirable to minimize the effects of optical turbulence on the system.

U.S Pat. No. 3,272,568 discloses a guide means comprising a fixed guide member and a guided body adapted to move relative thereto by means of a magnetically coupled air bearing. The air bearing includes a plurality of channels disposed in the guide member or guide body. Compressed air is supplied to the channels to provide an air cushion between the guide member and body. A plurality of magnets are disposed in the guide member or body to magnetically bias or couple the guide member and body.

Accordingly, it is the general object of the present invention to provide an imaging system to overcome the disadvantages of the prior art.

It is another object to provide a method and apparatus for positioning a lens of an imaging system that improves the quality of the image scanned onto the media.

It is a further object to provide a method and apparatus for positioning a lens of an imaging system that reduces the effect of air turbulence to the optical beam provided to the carriage assembly.

It is yet another object to provide a method and apparatus for positioning a lens of an imaging system that provides a cost effective means of focusing the optical beam on the substrate.

SUMMARY OF THE INVENTION

According to the present invention, a beam expander apparatus for magnifying and focusing an optical beam of an imaging system, which includes an exposure surface for supporting media, a rigid spar extending the longitudinal length of and parallel to the media, a carriage slidably coupled to the spar, a spinner motor secured to the carriage, a mirror attached to the spinner motor for reflecting the optical beam, a carriage drive means for moving the carriage along the spar in response to drive signals, and a motion control system electrically connected to the carriage drive means for providing the drive signals to move the carriage along the spar in response to a motion control algorithm, the apparatus comprises a lens mount having a pair of engagement surfaces and a lens secured to the lens mount for receiving the optical beam. The apparatus further comprises a bearing means disposed on the carriage for slidably moving the lens mount along the carriage and an engagement means for coupling the lens mount to the carriage. The apparatus also comprises a means for urging the lens mount to an initial position on the carriage and a catch means for engaging and maintaining the lens mount in fixed relationship to the spar.

Another aspect of the present invention is a beam expander apparatus for magnifying and focusing an optical beam of an imaging system, which includes an exposure surface for supporting media, a rigid spar extending the longitudinal length of and parallel to the media, a carriage slidably coupled to the spar, a spinner motor secured to the carriage, a mirror attached to the spinner motor for reflecting the optical beam, a carriage drive means for moving the carriage along the spar in response to drive signals, and a motion control system electrically connected to the carriage drive means for providing the drive signals to move the carriage along the spar in response to a motion control algorithm, the apparatus comprises a lens mount having a pair of engagement surfaces and a lens secured to the lens mount for receiving the optical beam. The apparatus further comprises an air bearing integral to the carriage having a pair of guide surfaces. The air bearing including an engagement means secured to the guide surfaces of the carriage for providing an attractive force to couple the lens mount to the carriage. The air bearing further including a passageway terminating at a plurality of output orifices arranged in a pattern on the guide surfaces of the carriage and an input orifice for supplying compressed air to the passageway, whereby the compressed air exiting said output orifices provide repulsive force opposite the attractive force of said engagement means for maintaining a gap between the guide surfaces of the carriage and the engagement surfaces of the lens mount enabling the lens mount to move along the carriage to vary the diameter of the optical beam. The apparatus also comprises a means for urging the lens mount to an initial position on the carriage and a catch means for engaging and maintaining the lens mount in fixed relationship to the spar.

Another aspect of the present invention is an imaging system having an optical beam for scanning media secured to an exposure surface that comprises a rigid spar extending the longitudinal length of the exposure surface a predetermined distance from the exposure surface, a lens mount having a pair of engagement surfaces, and a lens secured within a lens mount for receiving the optical beam. The imaging system further comprises a carriage coupled to the spar. The carriage includes a pair of guide surfaces having an engagement means secured to said guide surfaces of the carriage for providing an attractive force to couple the lens mount to the carriage. The carriage further includes a passageway terminating at a plurality of output orifices arranged in a pattern on the guide surfaces of the carriage, and an input orifice for supplying compressed air to the passageway, whereby the compressed air exiting the output orifices provides a repulsive force opposite the attractive force of the engagement means for maintaining a gap between the guide surfaces of the carriage and the engagement surfaces of the lens mount enabling the lens mount to move along the carriage to vary the diameter of the optical beam.

The imaging system further comprises a mirror for reflecting an optical beam and a spinner motor secured to the carriage. The mirror is secured to the spinner for rotating the mirror to scan the media. The imaging system also comprises a means to urge the lens to an initial position on the carriage and a catch means for engaging and maintaining the lens mount in fixed relation to the spar. The carriage is moved along the spar by a drive means in response to drive signals provided by a motion control system electrically connected to the drive means in response to a motion control algorithm.

Another aspect of the present invention is a method for focusing and establishing the diameter of an optical beam through a beam expander mechanism coupled to a spar of an imaging system. The beam expander mechanism includes a carriage coupled to the spar and a lens secured within a lens mount movably coupled to the carriage. The method comprises the steps of moving the carriage to an initial position on the spar, decoupling the lens mount from the carriage, moving the lens mount to an initial position on the carriage, fixing the lens mount in a fixed position relative to the spar, moving the carriage a predetermined distance along the spar, coupling the lens to the carriage, and releasing the lens mount.

Another aspect of the present invention is a method for focusing and establishing the diameter of an optical beam through a beam expander mechanism coupled to a spar of an imaging system. The beam expander mechanism includes a carriage coupled to the spar, a lens secured within a lens mount movably coupled to the carriage, and a magnetically coupled air bearing system for movably coupling the lens mount to the carriage. The method comprises the steps of moving the carriage to an initial position on the spar, actuating the air bearing system for enabling movement of the lens mount, moving the lens mount to an initial position on the carriage, fixing the lens mount in a fixed position relative to the spar, moving the carriage a predetermined distance, deactuating the air bearing system to magnetically couple the lens mount to the carriage, and releasing the lens mount.

The above and other objects and advantages of this invention will become more readily apparent when the following description is read in conjunction with the accompanying drawings.

DETAILED DESCRIPTION OF THE PREFERRED EMBODIMENTS

Figure 1:
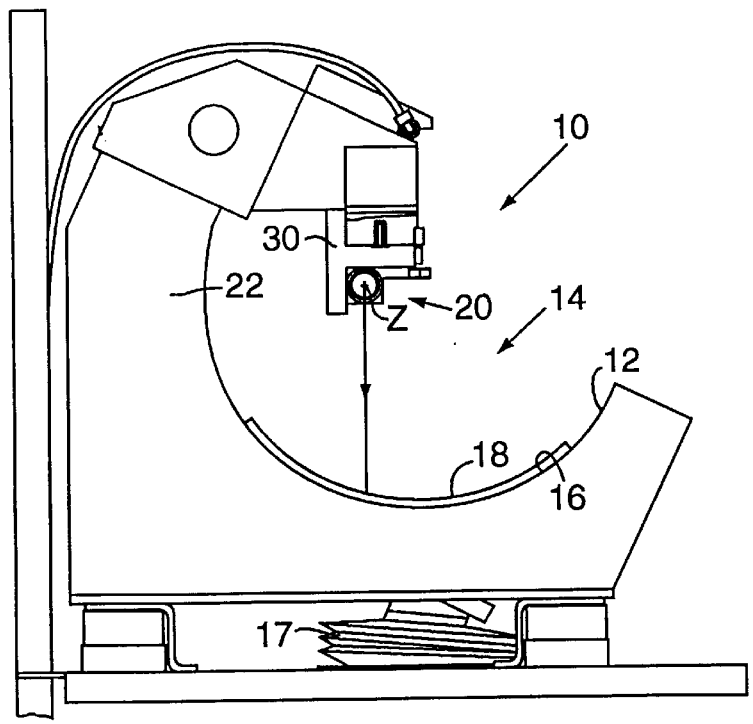
FIG. 1 is a side elevational view of a preferred embodiment of an imaging device having a beam expander apparatus in accordance with the present invention.

FIG. 1 illustrates an imaging device, specifically an internal drum photoplotter, generally designated 10, embodying this invention. The photoplotter includes a portion of a cylindrical, generally crescent-shaped drum 12 defining an exposure chamber 14. The interior surface 16 of the drum 12 defines an internal support structure for supporting a media sheet or plate 18 within the exposure chamber 14 in a given orientation to a point along the central axis z of the internal drum. The media sheets 18 may be a sheet of aluminum or polymer, such as polyester, having a photosensitive emulsion coated on one surface thereof or a sheet of photosensitive film. A plurality of apertures (not shown) defined by the support surface 16 of the internal drum 12 are provided for the purpose of drawing the plate or sheet 18 down onto the support surface under vacuum pressure applied by a vacuum generator and associated manifold system 17 disposed below the drum in the lower portion of the structure.

The plotter 10 further includes a controller 19, an optical beam generator 21, such as a laser diode, and beam forming optics secured to a frame structure 22 for directing an optical beam emitted from the beam generator 21 through the beam forming optics coincidentally along the central axis z of the internal drum 12. The controller 19 modulates the optical beam in response to digital signals of an image provided by a raster image processor (not shown). The image is then scanned to the media 18 as described above.

Figure 2:
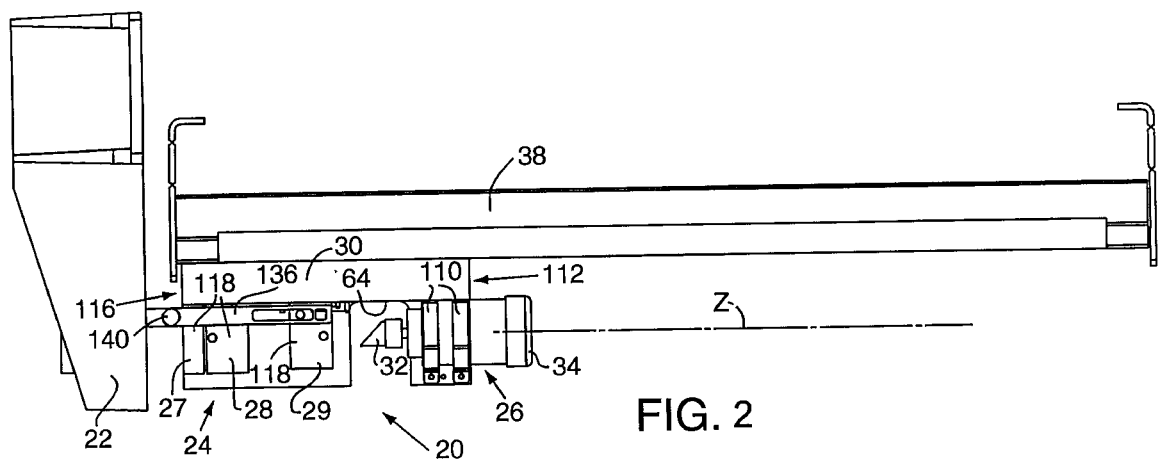
FIG. 2 is a front elevational view of the motion system and beam expander apparatus of the imaging device of FIG. 1.
Figure 3:
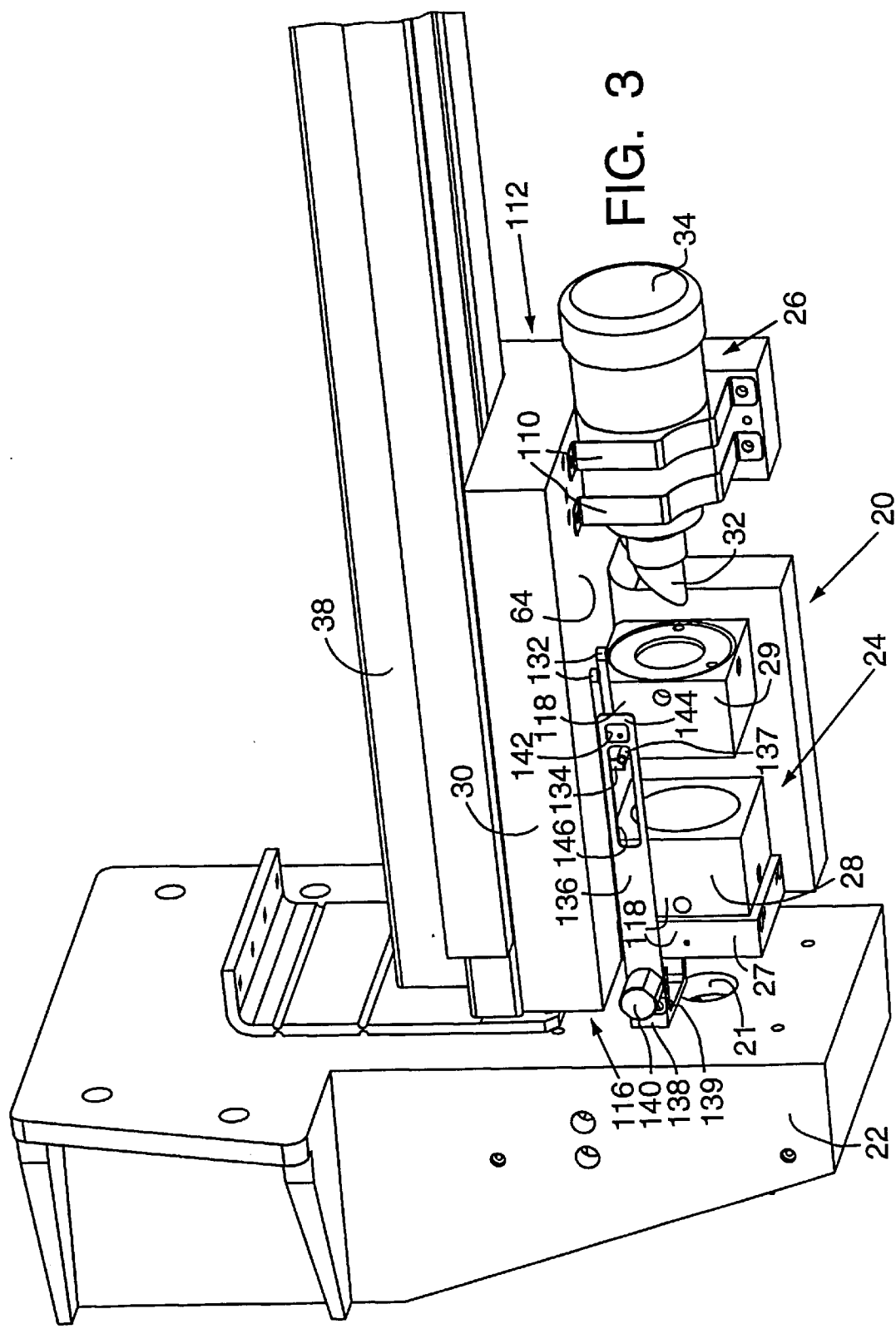
FIG. 3 is an expanded, front perspective view of the carriage and spar of the beam expander aparatus of the imaging device of FIG. 1.

Referring to FIGS. 2 and 3, the scanning means 20 comprises a beam expander mechanism 24 and a spinner assembly 26 mounted to a carriage suspended above the internal drum. The beam expander mechanism 24, described in greater detail hereinafter, includes a plurality of lens 27, 28, 29 secured to the carriage 30 for magnifying and focusing the optical feed beam from the optical beam generator 21 onto the media. The spinner assembly 26 includes an off-axis parabolic mirror 32 mounted to a spinner motor 34 for causing the optical feed beam directed along the central axis z of the drum 12 through the beam expander mechanism 24 to be turned substantially orthogonal toward the support surface 16 (see FIG. 1), focused on the emulsion coated surface of the media 18, and swept through a given arc across the surface in raster format. Each sweep of the beam across the media 18 forms a scan line of a sequence of pixels. The rate of rotation of the parabolic mirror 32 is in the range of 12,000 to 24,000 rotations per minute.

Figure 4:
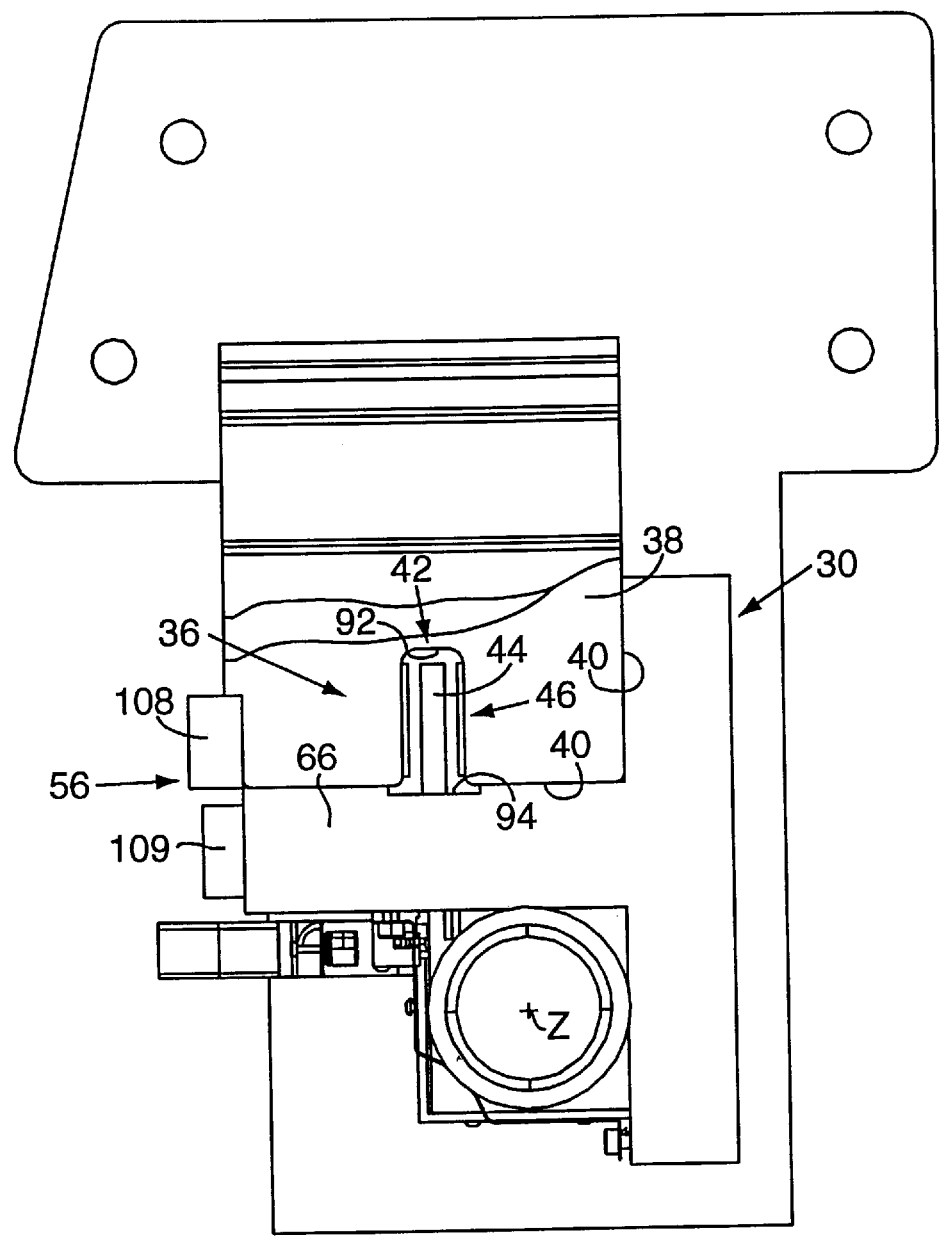
FIG. 4 is an expanded, side elevational view of the carriage and spar of the imaging device of FIG. 1.
Figure 7:
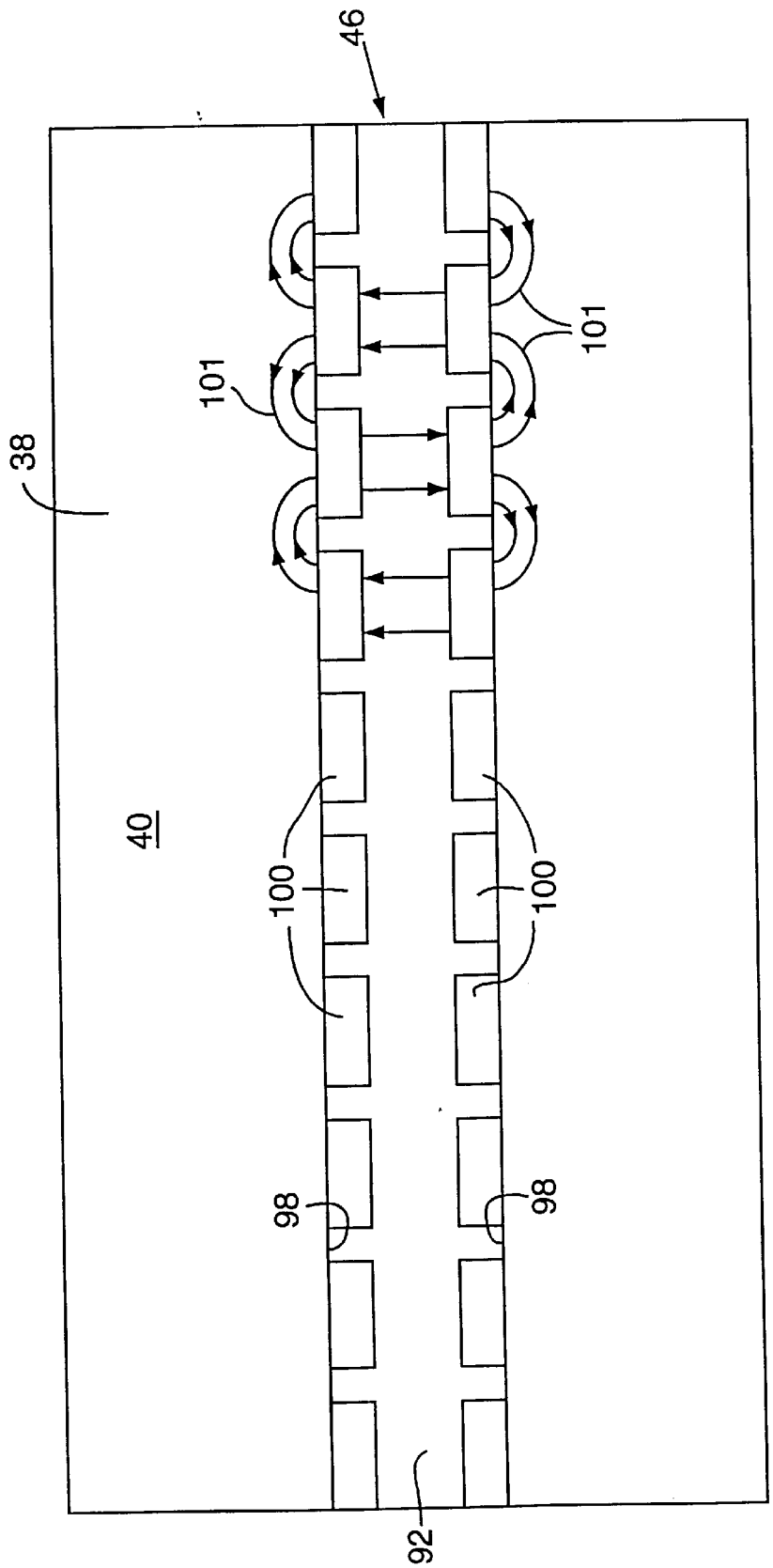
FIG. 7 is a top plan view of a portion of the spar illustrating the magnetic track assembly of the linear motor.

As best shown in FIGS. 2 and 4, the carriage assembly 30 is coupled by a magnetically preloaded air bearing system 36 to a spar 38 having a pair of precision ground or lapped surfaces 40, 40. The spar extends parallel to the central axis z of the internal drum 12. Referring to FIGS. 4 and 7, the movement of the carriage 30 along the spar 38 is provided by a linear motor 42 mounted to the carriage. The linear motor 42 includes a coil assembly 44 and a magnetic track assembly 46. The controller 19 provides motor control signals to a motor drive system 48, schematically illustrated in FIG. 8, which provides the drive signal to the coil assembly 44 of the motor 42. The motor drive system 48 includes a servo controller 52, a servo amplifier 54, a linear scale or encoder 56, and a media edge detector 57.

Figure 5:
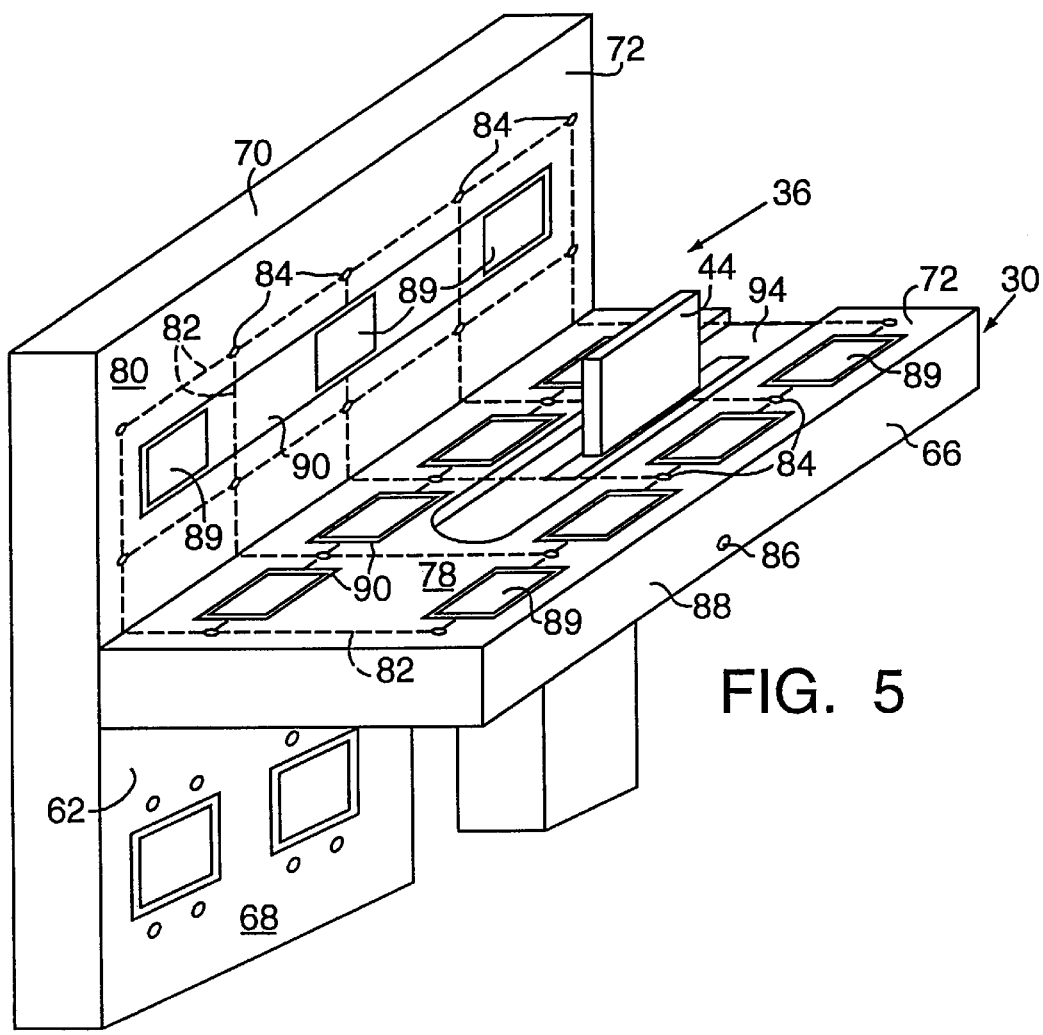
FIG. 5 is a perspective view of the carriage of the imaging device of FIG. 1 showing the upper surfaces of the carriage.
Figure 6:
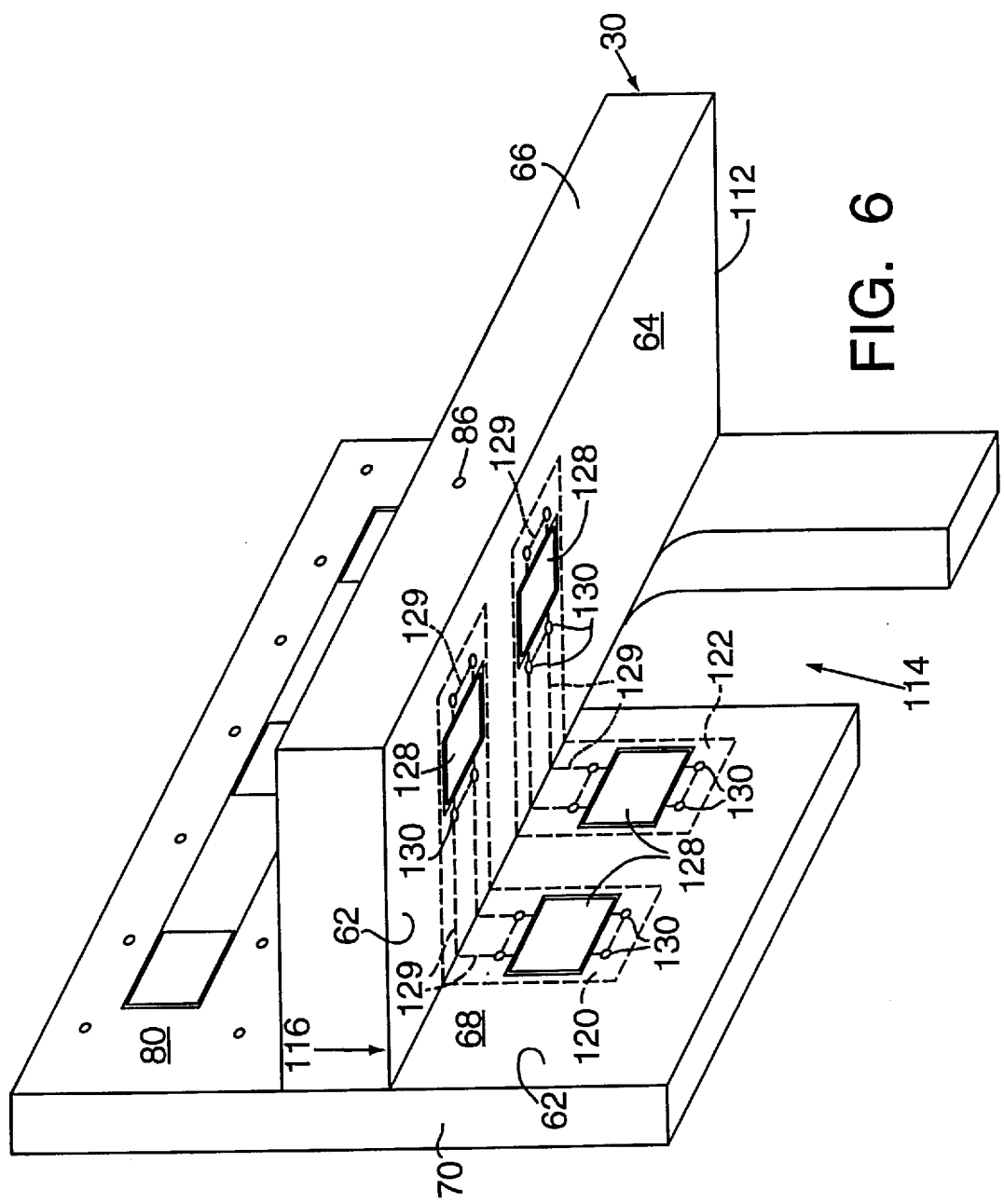
FIG. 6 is a perspective view of the carriage of the imaging device of FIG. 1 showing the lower surfaces of the carriage.

Turning now to the magnetically preloaded air bearing motion system 36 shown in FIGS. 5 and 6, the carriage 30 includes a pair of generally rectangular plates 66, 70 of non-ferromagnetic material, such as aluminum, secured orthogonally together by mechanical fasteners, such as bolts, to form a T-shaped carriage rotated ninety degrees. A pair of downwardly opening orthogonal walls 62, 62 for mounting the scanning assembly 26 thereto are defined by a bottom surface 64 of the horizontal plate 66 and a lower inner surface 68 of the vertical plate 70. A pair of upwardly opening orthogonal walls 72, 72 for slidably engaging the orthogonal surfaces 40, 40 of the spar 38 (See FIG. 4) are defined by a top surface 78 of the horizontal plate 66 and an upper inner surface 80 of the vertical plate 70.

The orthogonal plates 66, 70 of the carriage 30 include a series of interconnected air passageways 82 (shown in phantom) that terminate at a plurality of orifices 84 arranged in a predetermined pattern on the upper orthogonal surfaces 78, 80. The passageways 82 further include a common supply orifice 86 exiting from a side wall 88 of the horizontal plate 66. Compressed gas, such as air, is provided to the supply orifice 86 through a tube (not shown) which flows through the passageways 82 of the carriage 30 and exits the orifices 84 to repel the carriage away from the orthogonal surfaces 40, 40 of the spar 38. On the upper vertical surface 80 and upper horizontal surface 78, the orifices 84 are arranged in two parallel rows equi-spaced apart along the length of the carriage 30.

The carriage 30 is preloaded or coupled by a plurality of magnetic means 89, such as rare earth permanent magnets or electromagnetic means, secured by an adhesive or mechanical fastener within a plurality of pockets 90 arranged in a predetermined pattern in the upper orthogonal walls 72 of the carriage 30. The magnets 89 are mounted preferably recessed from or coplanar with the upper orthogonal surfaces 78, 80. The magnets 89 mounted in the upper surface 80 of the vertical wall 70 are linearly arranged and equi-spaced between the two rows of orifices 84. The magnets 89 mounted in the top surface 78 of the horizontal plate 66 are arranged in two parallel rows colinear and interposed with the parallel rows of orifices 84.

The permanent magnets 89 provide an attractive force opposite to the repulsive force of the compressed air such that the carriage 30 is maintained in a parallel relationship a predetermined small distance from the spar 38. The strength of the magnets 89 is such that their attractive force is balanced to equal the repulsive force of the compressed air and gravity in the vertical direction so that an air gap between the spar 38 and the orthogonal surfaces 78, 80 of the carriage 30 is approximately 8 microns which provides a preferred degree or value of "stiffness". "Stiffness" is defined as the resistance to lateral movement in the X or Y axis, or angular deflection about the pitch, roll and yaw axis of the carriage 30 relative to the spar 38 when an external force is applied to the carriage.

Referring to FIGS. 4 and 7, the linear motor 42, similar to one manufactured by Trilogy Systems Corp., provides the motive force to move the carriage 30 along the length of the spar 38. The linear motor 42 is preferably a d.c. brushless motor comprising a coil assembly 44 and a magnetic track assembly 46. The coil assembly 44 includes a plurality of motor windings or phases (not shown).

Imaging devices in the field of graphic arts require a high degree of precision when scanning the imaging beam onto the media and, therefore, travel of the carriage 30 along the spar 38 at a constant velocity is critical. Discontinuity in the movement or variation in velocity of the carriage results in the problem of "banding" or longitudinal lines formed in the media 18.

The motor phases of the linear motor 42 are therefore switched or commutated preferably by sinusoidal commutation. Sinusoidal commutation provides near perfect smoothness, meaning the carriage 30 travels at a controlled velocity with little or no bounce or discontinuity in the movement of the carriage 30. The velocity of the carriage is typically low, i.e. 10 microns/2.5 msec or 4 mm/sec. At this rate, each scan line must be uniformly spaced within a small fraction of a scan line (1/100 of a line), or objectionable image signature (banding) results. Therefore, the velocity must be uniform down to levels of less than 1.0% over frequency ranges up to and including 400 Hz.

The motor phases may also be switched using Hall Effect devices that are integral to the coil assembly 44. The use of Hall Effect devices, however, create a force discontinuity in the linear motor 42 resulting in an inconsistent rate of movement of the carriage 30, and therefore are preferably used for point to point positioning of the load.

Referring to FIGS. 4 and 5, the coil assembly 44 is mounted to the top surface 78 of the horizontal plate 66 within a groove or recess 94 centrally disposed along the longitudinal axis of the carriage 30 between the rows of magnets 89 and orifices 84.

In the preferred embodiment of the invention shown in FIGS. 4 and 7, the magnetic track assembly 46 is embedded in or integral with the spar 38. A U-shaped channel 92 extending longitudinally in the bottom surface 40 of the spar 38 includes a pair of opposing side walls 98. Magnets 100 for the tracking assembly 46 are secured to the side walls 98 of the channel 92 so the two rows of magnets face each other. The magnets 100 of each row are secured with opposite and alternating polarity so that the direction of the flux fields 101 alternates with each opposing pair of magnets.

The width of the channel 92 is sufficiently wide to permit the coil assembly 44 of the linear motor 42 to freely pass between the rows of magnets 100 secured within the channel of the spar resulting in frictionless movement of the carriage 30.

The spar 38 is formed of extruded ferromagnetic material, such as magnetically permeable steel, which provides a path for the flux fields 101 created between opposing pairs of magnets. The spar 38 must also be sufficiently rigid to ensure minimal flexure as the carriage 30 moves along the spar.

Figure 9:
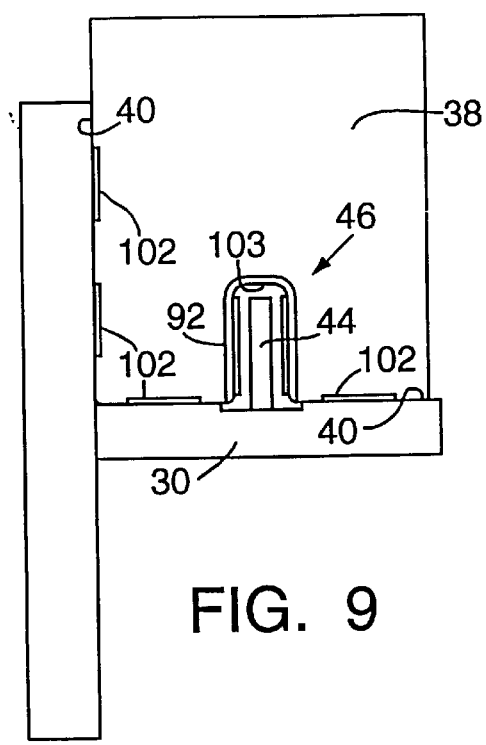
FIG. 9 is a side elevational view of the carriage and spar of an alternative embodiment of the motion system of the imaging device of FIG. 1.

In the alternative shown in FIG. 9, the spar 38 may be formed of granite. The advantage of a granite spar is the orthogonal surfaces 40, 40 can be accurately lapped to very precise tolerances of smoothness and straightness. Furthermore, the granite material is less susceptible to warping or bending as a result of internal stresses and environmental conditions. To magnetically couple the carriage 30 to the granite spar 38, the spar requires a plurality of strips 102 or sections of ferromagnetic material inlaid within the orthogonal surfaces 40, 40 of the spar by an adhesive material. The strips 102 are disposed longitudinally the length of the spar 38 opposite the magnets 89 (see FIG. 5) secured in the carriage walls. The strips and orthogonal walls of the granite spar are simultaneously lapped to provide flat coplanar surfaces for engaging the carriage 30.

To form the magnetic track assembly 46, a generally U-shaped track 103 of ferromagnetic material must be secured within the channel 92 disposed in the bottom surface 40 of the spar to provide the return paths for the flux fields 101 of the magnets 100. The magnets 100 are then secured to the inner side walls of the U-shaped track 103.

Figure 10:
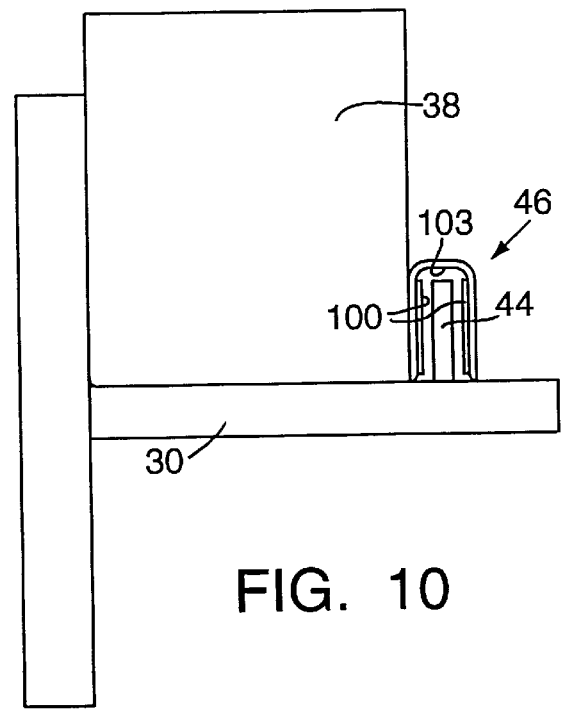
FIG. 10 is a side elevational view of the carriage and spar of another alternative embodiment of the motion system of the imaging device of FIG. 1.

In a third alternative shown in FIG. 10, an independent magnetic track assembly 46 having the magnets 100 secured to the inner side walls of a U-shaped track 103 of ferromagnetic material may be mounted to or parallel to the spar 38.

Figure 8:
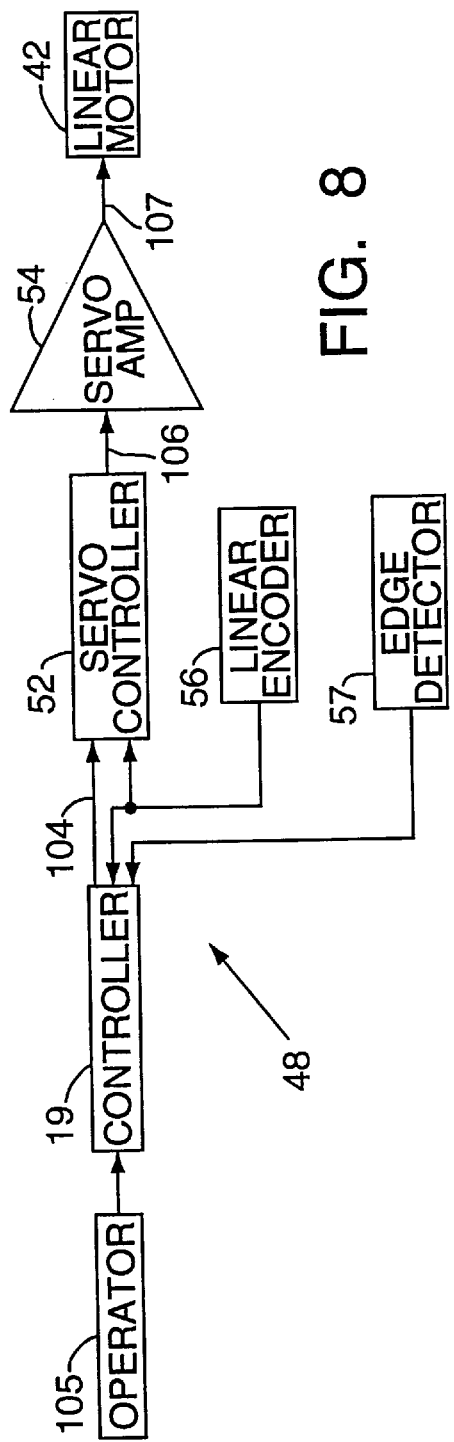
FIG. 8 is a schematic functional diagram of the linear motor drive system for the motion system of the imaging device of FIG. 1.

Schematically shown in FIG. 8, the motor drive system 48 includes a servo controller 52, a servo amplifier 54, a linear encoder 56 and a media edge detector 57. The motor drive system 48 provides the drive signals to the windings of linear motor 42. The controller 19 includes an algorithm that provides output signals over a serial RS232 port 104 to the servo controller 52, such as one manufactured by Delta Tau, in response to input signals provided by the operator 105, linear encoder 56 and edge detector 57. The servo controller 52 provides a servo signal through conductor 106 to the servo amplifier 54 which then provides sinusoidal drive signals to the coil assembly 44 of the linear motor 42 through conductor 107. The linear encoder 56 provides a signal indicative of the position (with the encoder resolution of 0.25 micron) of the carriage 30 along the spar 38 to the servo controller 52 to close the position loop of the servo and to the controller 19. The position of the carriage 30 is stored in the memory of the controller 19 which monitors the position of the carriage 30 as it travels along the spar 38. Based upon the input of the operator 105 and the position of the carriage 30, the algorithm provides the output signal to the servo controller to drive the motor to begin and end the movement of the carriage and control the velocity of the carriage. The algorithm also functions to provide an image scan enabling/disabling signal to initiate and end the scanning of the optical beam from the beam generator onto the media.

Referring to FIG. 4, the linear encoder 56 includes a linear scale 108 and an encoder head 109. The scale 108 is mounted longitudinally to the lower edge of the spar 38 and the encoder head 109 is mounted to the edge of the horizontal plate 66 of the carriage 30. In the preferred embodiment, the resolution of the encoder is 0.25 micron.

In the operation of the motor drive system 48, the controller 19, in response to the algorithm, provides a signal to the servo controller 52 to energize the linear motor 42 and move the carriage to a predetermined initial position at one end of the spar 38. A position register of the controller 19 is then initialized to zero counts. After the media 18 is secured within the internal drum 12, the carriage 30 is commanded by the controller to move forward until the edge of the media is detected by an edge detector 57. The controller 19 stores in memory the number of counts between the initial position and the edge of the media 18 and commands the linear motor 42 to move the carriage 30 to approximately ¼ to ½ inch back from the edge position of the media. This predetermined distance permits the carriage 30 to accelerate to a constant velocity before reaching the edge of the media 18. When it is desired to begin the imaging process, the controller 19 energizes the linear motor 42 to move the carriage a distance equal to the image length plus a deceleration distance. When the controller determines the carriage 30 has reached the active edge of the media, the controller provides an initiating signal to begin the laser scanning of the image onto the media. After the carriage 30 has traveled the commanded distance along the spar 38, the controller 19 provides a signal to stop the laser scanning. The controller then commands the carriage 30 to slew or scram the carriage back to the zero or rest position at a predetermined velocity. The air bearing system 36 permits a much greater scram or slew rate of the carriage 30 back to its initial position than the scram rate of a carriage drive by a lead screw and stepper motor.

Referring to FIGS. 3 and 6, the spinner assembly 26 and beam expander mechanism 24 of the scanning means 20 are secured to the lower orthogonal surfaces 64, 68 of the carriage 30. The spinner assembly 26 is mounted to the carriage 30 by a pair of straps 110 to the forward end 112 of the carriage such that the parabolic mirror 32 is coaxial with the central axis z of the internal drum 12 (see FIG. 2). The lower vertical wall 62 has a U-shaped cutout 114 to permit the substantially orthogonal reflected image beam to scan the entire width of the media 18 as the parabolic mirror 32 rotates.

The beam expander mechanism 24 is mounted at the rearward end 116 of the carriage 30 and includes three coaxially mounted discrete lenses 27, 28, 29 for magnifying the diameter of the optical feed beam generated by the optical beam generator 21. Locating the beam expander mechanism on the moveable carriage permits the use of a smaller diameter beam which minimizes the effects of optical turbulence of the imaging system 10 and its adverse affects on image quality. In the internal drum system, the optical feed beam is exposed to air turbulence as it travels down the central axis z of the drum 12 to the parabolic mirror 32 on the carriage 30. It is known that the greater the diameter of the axial feed beam, the greater the effects of air turbulence. For this reason, the present invention sends a smaller and fixed size optical beam down the axis z of the internal drum 12. The typical diameter of the feed beam (measured at the 13% points) for a system having no beam expander mechanism 24 on the carriage 30 is approximately 16.4 millimeters (mm) while the diameter of the feed beam to the moveable carriage is approximately 4 mm for a system having a beam expander mechanism on the carriage.

In the preferred embodiment of the beam expander mechanism 24, the characteristics of the lens 27, 28, 29 provide afocal expansion of the diameter of the optical feed beam. "Afocal" means that the feed beam and output beam of the beam expander mechanism are both parallel (collimated) to the axis of the lens. One skilled in the art, however, would recognize that any type of multi-configuration lens is possible without departing from the invention. The first or rearward most lens 27 is fixed securely to the carriage. The second and third lenses 28, 29 respectively are secured to the carriage by magnetic coupling. Two independently controlled air bearing 120, 122 provide the means for adjustably positioning the lenses 28, 29 to vary the magnification and focus of the axial feed beam exiting the beam expander mechanism 24.

Each of the lens 27, 28, 29 are disposed within a generally square block or mount 118 formed of steel or other ferromagnetic material and having a pair of orthogonal surfaces for engaging the lower orthogonal surfaces 64 and 68 of the carriage 30. Similar to the magnetically pre-loaded air bearing system for the motion system, the carriage 30 provides two independent magnetically coupled air bearings 120, 122 for the second and third lens 28 and 29 respectively. Each air bearing 120, 122 includes a pair of rare earth permanent magnets 128 with one magnet 128 disposed in each surface 64, 68 of the carriage 30. The air bearings 120, 122 also include two independent networks of passageways 129 (shown in phantom) that terminate at a plurality of orifices 130 disposed in the lower orthogonal surfaces 64, 68. The orifices 130 of each network of passageways are arranged in a predetermined pattern about each pair of permanent magnets 128 for each lens mount 118. The dimensions of the magnets 128 must be of sufficient area to accommodate the necessary distance of travel of the lenses 28, 29 along the carriage 30. Similarly, the number and arrangement of the orifices 130 must also cover sufficient area to provide an air cushion between the surfaces of the mounts 118 and the carriage over the travel distance of the lenses 28, 29. The mounts 118 must provide sufficient surface area to provide stability while being moved. In the preferred embodiment, the width of the lens mount is approximately 45 mm. The magnetically preloaded air bearing provides a means to provide frictionless movement of the lens by forcing compressed air through the passageways and the orifices, and means to secure the lenses 28, 29 in place by removing the air supply resulting in the lens mounts magnetically coupled in fixed relationship to the carriage 30.

As best shown in FIG. 3, the second and third lenses 28, 29 each include a constant force spring 132 having one end secured to the bottom horizontal surface 64 of the carriage 30 and the other end secured to the mount 118 for the lenses 28, 29. The springs 132 are tensioned to urge their respective lenses forward along the cylindrical axis z to a pair of stop pins 134 mounted to the bottom horizontal surface 64 of the carriage 30 for stopping the forward movement of the lenses 28, 29. The stop pins provide a known location or relationship between the three lens 27, 28, 29 when the second and third lenses 28, 29 are urged against the stop pins.

The beam expander mechanism 24 further includes an arm member 136 for engaging a catch pin 137 extending laterally outward from each of the mounts 118 of the second and third lenses 28, 29. The arm member 136 extends longitudinally adjacent the carriage 30 and has its rearward end 138 pivotally secured to the frame 22 of the imaging system 10. A spring means 139 urges the arm member 136 outward laterally from the carriage 30. A pneumatic piston 140 is mounted to the frame of the imaging system perpendicular to the arm member 136 so that when actuated, the piston urges the arm member inwardly over the catch pins 137 of the lens mounts 118. The arm member has a forward opening 142 at its free end 144 for hooking or engaging the catch pins 137. The forward opening 142 is greater than the cross-sectional area of the stop pins 137 to ensure the catch pin is hooked by the arm member. The arm member 136 further includes an elongated opening 146 adjacent the smaller forward opening to accommodate the catch pin 137 of the second lens 28 when the forward opening 142 engages the catch pin 137 of the third lens 29. The advantage of the elongated opening 146 is that a single arm member 137 can engage both catch pins 137 of the lens mount without the catch pin of the second lens interfering with the arm member.

Furthermore, temperatures within the photoplotter 10 vary over a wide range which effect the focus and magnification of the lenses 27, 28, 29 disposed on the carriage 30. To compensate for these variations, a temperature sensing means (not shown), such as a thermocouple, may be secured to the carriage 30 or within the internal chamber about the area of the carriage. The temperature sensing means provides a temperature signal to the controller 19 which is used to additionally modify the position of the lenses on the carriage to compensate for the wide range of environmental temperatures.

In the operation of positioning the second and third lenses 28, 29 of the beam expander mechanism 24, the controller 19 in response to a lens positioning algorithm independently controls the actuation of the air bearing systems 120, 122 for each of the lenses 28, 29, the movement of the carriage 30, and the actuation of the arm member 136.

The desired position of each of the lenses 27, 28, 29 on the carriage 30, while scanning, and the related beam magnification is dependent upon the characteristics (focal lengths) of the lenses and the desired spot size of the imaging beam. The spot diameter at the 50% intensity level is approximately equal to the separation (pitch) between scan lines. A range of spot sizes is required to support a range of resolutions, such as 1270 to 3810 dots/inch which requires the beam expander to have a minimum expansion range of 3:1. The diameter of the output or imaging beam of the beam expander mechanism is determined by the size of the input beam to the expander mechanism, the characteristics of the lenses (individual focal lengths), and the relative distances between the lenses. Once specific parameters of each lens have been empirically characterized for each lens 27, 28, 29 such as the focal length, the relative position between the three lenses may be calculated to determine the relative magnification of the beam expander mechanism and focus position of the imaging beam.

The influence of each lens of the input beam is characterized by the following transfer equations:

$$t_1 = f_1 + f_2 + (f_1 \times f_2 \times M)/f_3$$

$$t_2 = [f_2 \times ((M \times f_1) - f_1 + t_1)]/(t_1 - f_1 - f_2)$$

where:

$f_1$ = first lens focal length $f_2$ = second lens focal length $f_3$ = third lens focal length $t_1$ = separation between first and second lens $t_2$ = separation between second and third lens M = Magnification Ratio (Output Beam Diameter/ Input Beam Diameter)

Together the series of lenses and their respective spacings may be described as a single transfer equation. Based upon the desired magnification and focus position, the physical positions of the lenses 28, 29 relative to the locations of the stop pins are calculated by the controller 19. The desired magnification and focus position of the optical beam is dependent upon the wavelength of the optical beam, the parameters (thickness) of the media, and the resolution of the image. The lenses positions may then be calculated for a discrete set of magnifications and focus positions to form a look up table ("LUT") to expedite the positioning of the lenses 28, 29.

To move the lenses 28, 29, the controller 19 initially supplies compressed air to the passageways 129, 129 to activate the magnetically preloaded air bearings 120, 122 for the second and third lenses 28, 29 and "float" these lenses. The constant force springs 132 urge the lenses 28, 29 forward to the stop pins 134 to thereby provide a known position of the lenses. The compressed air to the air bearings 120, 122 are then deactivated thus magnetically locking the lenses 28, 29 in place. The controller 19 then provides a drive signal to the linear motor 42 to move the carriage 30 to its initial position on the spar 38 so that the forward opening 142 of the arm member 136 is aligned with the catch pin 137 of the second lens 28. The pneumatic piston 140 is then actuated to force the arm member 136 laterally inward to hook the catch pin 137 of the second lens 28 in the forward opening 142 of the arm member. The carriage 30 is then commanded to move forward until the powered carriage meets resistance and no longer moves forward (or stalls). The controller 19 stores the position of the carriage 30 in the stalled position from the feedback provided by the encoder 56 which is indicative of the relative initial position of the second lens 28. The drive signal to the linear motor 42 is then removed. The air bearing 120 for the second lens 28 is then actuated by providing compressed air to the passageways. The carriage 30 is commanded by the controller 19 to move for a predetermined distance or position provided by the look up table stored in the controller 19 from the relative initial position while the second lens is retained in fixed relationship to the spar by the arm member. After motion, the compressed air supplied to the air bearing 122 of the second lens 28 is removed to thereby magnetically lock the second lens in place. The pneumatic piston 140 is then deactivated to release the arm member 136 from the catch pin 137 of the second lens 28.

To position the third lens 29 on the carriage 30, the procedures described-above are similarly performed. The pneumatic piston 140 is actuated to force the arm member 136 inward to hook the catch pin 137 of the third lens in the forward opening 142. The catch pin 137 of the second lens 28 fits within the elongated opening 134 of the arm member 136. The carriage 30 is then commanded to move forward until it meets resistance and no longer moves forward. The controller 19 stores the position of the carriage which is indicative of the relative initial position of the third lens 29. The air bearing 122 for the third lens 29 is then actuated by providing compressed air to the passageways. The carriage 30 is then commanded by the controller 19 to move a predetermined distance provided by the LUT for the required spot size of the image beam reflected onto the media. The controller 19 then moves the compressed air from the third air bearing 122 to lock the third lens 29 in place. The pneumatic plunger 140 is deactivated and retracted resulting in the arm member 136 moving laterally outward and releasing the third lens 29.

Figure 11:
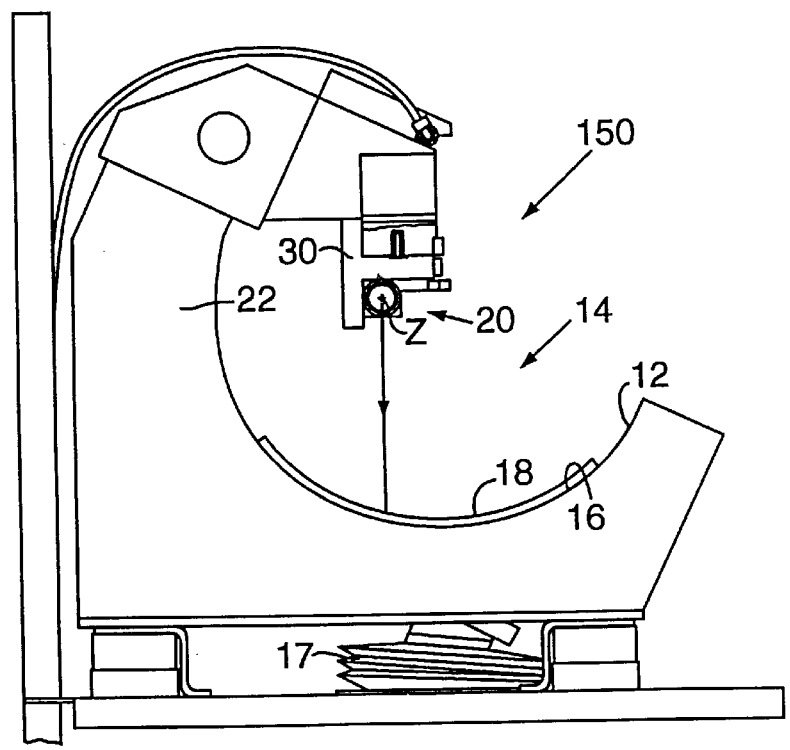
FIG. 11 is a side elevational view of a preferred embodiment of an scanning imaging device having a beam expander apparatus in accordance with the present invention.

Referring to FIG. 11, the preferred embodiment of the motion system and beam expander apparatus is describe for the use in a photoplotter 10, however one skilled in the art would recognize that they may also be used in a scanning imaging system 150 wherein an optical beam is emitted or reflected from the media to a mirror which directs the optical beam through the beam expander to an image processor for recording the scanned image disposed on the media.

One skilled in the art would recognize that the motion control system and the beam expander mechanism may be used for any imaging system such as those systems comprising a flat imaging bed or an external imaging drum.

Furthermore, the walls of the carriage, the spar and the lens mounts in the preferred embodiment are orthogonal, however, the walls may be of any angle without departing from the invention, provided the walls constrain the carriage to the spar and the lens mounts to the carriage in two orthogonal planes.

An important advantage of the motion system of the present invention is the significantly improved quality of the image scanned onto the media by the optical beam. As described earlier, the quality of the image is greatly dependent upon the precision of the movement of the scanning means along the spar. The advantage of this motion system is that the magnetically preloaded air bearing provides a stiff, frictionless means to couple the carriage to the spar, thus providing a stable support for the scanning means. Furthermore, the frictionless coupling of the carriage to the spar in combination with the linear motor provides near perfect smoothness of travel of the carriage along the spar.

Although the invention has been shown and described with respect to an exemplary embodiment thereof, it should be understood by those skilled in the art that the foregoing and various other changes, omissions, and additions in the form and detail thereof may be made therein without departing from the spirit and scope of the invention.

Having thus described my invention, what is claimed is:

1. A beam expander apparatus for magnifying and focusing an optical beam of an imaging system, the imaging system including an exposure surface for supporting media, a rigid spar extending the longitudinal length of and parallel to said media, a carriage slidably coupled to said spar, a spinner motor secured to said carriage, a mirror attached to said spinner motor for reflecting said optical beam, a carriage drive means for moving said carriage along said spar in response to drive signals, and a motion control system electrically connected to said carriage drive means for providing said drive signals to move said carriage along said spar in response to a motion control algorithm, said apparatus comprising:

a lens mount having a pair of engagement surfaces;

a lens secured to said lens mount for receiving said optical beam;

a bearing means disposed on said carriage for slidably moving said lens mount along said carriage;

an engagement means disposed said carriage for coupling said lens mount to said carriage;

a means for urging said lens mount to an initial position; and a catch means for engaging and maintaining said lens mount in fixed relationship to said spar.

2. A beam expander apparatus, as set forth in claim 1, said means for urging the lens mount comprises a spring mechanism having an end secured to said carriage and another end secured to said lens mount.

3. A beam expander apparatus, as set forth in claim 1, said catch means comprising an arm member having one end hingedly secured to a fixed structure and the other end having a forward opening for receiving and engaging a catch pin outwardly extending from said mount.

4. A beam expander apparatus, as set forth in claim 1, wherein said engagement means includes a plurality of magnetic means secured in a pattern to said carriage.

5. A beam expander apparatus for magnifying and focusing an optical beam of an imaging system, the imaging system includes an exposure surface for supporting media, a rigid spar extending the longitudinal length of and parallel to said media, a carriage slidably coupled to said spar, a spinner motor secured to said carriage, a mirror attached to said spinner motor for reflecting said optical beam, a carriage drive means for moving said carriage along said spar in response to drive signals, and a motion control system electrically connected to said carriage drive means for providing said drive signals to move said carriage along said spar in response to a motion control algorithm, said apparatus comprising:

a lens mount having a pair of engagement surfaces;

a lens secured to said lens mount for receiving said optical beam;

a bearing means disposed on said carriage for slidably moving said lens mount along said spar;

an engagement means disposed in said carriage for coupling said lens mount to said carriage;

a means for urging said lens mount to an initial position; and a catch means for engaging and maintaining said lens mount in fixed relationship to said spar, and wherein the bearing means includes a passageway terminating at a plurality of output orifices arranged in a pattern on the guide walls of said carriage and an input orifice for supplying compressed air to said passageway, whereby the compressed air exiting said output orifices providing repulsive force opposite the attractive force of said engagement means for maintaining a gap between said guide surfaces of said carriage and said engagement surfaces of said lens mount.

6. A beam expander apparatus for magnifying and focusing an optical beam of an imaging system, said imaging system includes an exposure surface for supporting media, a rigid spar extending a longitudinal length of and parallel to said media, a carriage slidably coupled to the spar, a mirror attached to a spinner motor for reflecting said optical beam, a carriage drive means for moving said carriage along said spar in response to drive signals, and a motion control system electrically connected to said carriage drive means for providing said drive signals to move said carriage along said spar in response to a motion control algorithm, said apparatus comprising:

a lens mount having a pair of engagement surfaces;

a lens secured to said lens mount for receiving said optical beam;

an air bearing integral to said carriage having a pair of guide surfaces, said air bearing including an engagement means secured to the guide surfaces of said carriage for providing an attractive force to couple said lens mount to said carriage, said air bearing further including a passageway terminating at a plurality of output orifices arranged in a pattern on said guide surfaces of said carriage and an input orifice for supplying compressed air to said passageway, whereby the compressed air exiting said output orifices provide repulsive force opposite said attractive force of said engagement means for maintaining a gap between said guide surfaces of said carriage and said engagement surfaces of said lens mount enabling said lens mount to move along said carriage to vary the diameter of said optical beam;

a means for urging said lens mount to an initial position;

a catch means for engaging and maintaining said lens mount in fixed relation to said spar.

7. A beam expander apparatus, as set forth in claim 6, said means for urging said lens mount comprises a spring mechanism having an end secured to said carriage and another end secured to said lens mount.

8. A beam expander apparatus, as set forth in claim 6, said lens mount includes notch pin extending outwardly from said lens mount.

9. A beam expander apparatus, as set forth in claim 8, said catch means comprising an arm member having one end hingedly secured to a fixed structure and the other end having a forward opening for receiving and engaging said catch pin outwardly extending from said lens mount.

10. A beam expander apparatus, as set forth in claim 6, wherein said engagement means includes a plurality of magnetic means secured in a prearranged pattern disposed in the walls of said carriage.

11. A beam expander apparatus, as set forth in claim 10, wherein said magnetic means comprises permanent magnets formed of rare earth material.

12. An imaging system having an optical beam for scanning media secured to an exposure surface, said imaging surface comprising:

a rigid spar extending the longitudinal length of said exposure surface a predetermined distance from said exposure surface;

a lens mount having a pair of engagement surfaces;

a lens secured to said lens mount for receiving said optical beam;

a carriage coupled to said spar, said carriage including a pair of guide surfaces having an engagement means secured to said guide surfaces of said carriage for providing an attractive force to couple said lens mount to said carriage, said carriage further including a passageway terminating at a plurality of output orifices arranged in a pattern on said guide surfaces of said carriage and an input orifice for supplying compressed air to said passageway, whereby the compressed air exiting said output orifices provide repulsive force opposite said attractive force of said engagement means for maintaining a gap between said guide surfaces of said carriage and said engagement surfaces of said lens mount enabling said lens mount to move along said carriage to vary the diameter of said optical beam;

a mirror for reflecting said optical beam;

a spinner motor secured to said carriage, said mirror secured to said spinner for rotating said mirror to scan the media;

a means for urging said lens mount to an initial position on said carriage;

a catch means for engaging and maintaining said lens mount in fixed relation to said spar;

a drive means for moving said carriage along said spar in response to drive signals; and a motion control system electrically connected to said drive means for providing said drive signals to move said carriage along said spar in response to a motion control algorithm.

13. An imaging system, as set forth in claim 12, wherein said imaging system is a photoplotter including an optical beam generator for providing said optical beam that passes through said lens and reflects off said mirror to exposure media secured to said exposure surface.

14. An imaging system, as set forth in claim 13, wherein said lens mount includes an outwardly extending catch pin.

15. An imaging system, as set forth in claim 13, said catch means comprises an arm member having one end hingedly secured to a fixed structure and the other end having a forward opening for receiving and engaging the catch pin of said lens mount.

16. An imaging system, as set forth in claim 13, further comprising:

a second lens mount having a pair of engagement surfaces; and a second lens secured to said second lens mount for receiving said optical beam, said lens mount is coupled to said carriage.

17. An imaging system, as set forth in claim 16, wherein said carriage comprises a second independent passageway having a plurality of output orifices and a second input orifice for supplying compressed gas to said second passageway, whereby the compressed air exiting said output orifices provide a repulsive force opposite said attractive force of said engagement means for maintaining a second gap between said guide surfaces of said carriage and said engagement surfaces of said second lens mount enabling said second lens mount to move independently and relative to said first lens mount to focus said optical beam.

18. An imaging system, as set forth in claim 13, further comprising a stop pin extending outwardly from a guide surface of said carriage for maintaining said lens mount at said initial position.

19. An imaging system, as set forth in claim 15, further comprising an actuator means for forcing said arm member to engage said catch pin of said lens mount.

20. An imaging system, as set forth in claim 17, wherein said first and second lens mounts include an outwardly extending catch pin;

said catch means comprises an arm member having an end hingedly secured to a fixed structure and the other end having a forward opening for receiving and engaging said catch pins of said first and second lens mounts; said arm member further comprises an elongated opening disposed rearward of said forward opening for receiving said catch pin of said second lens to said forward opening to receive said catch pin of said first lens.

21. An imaging system, as set forth in claim 13, further comprising an edge detector means for providing signals to said motion control system indicative of the location of an edge of said media.

22. An imaging system, as set forth in claim 13, wherein said drive means includes a linear motor comprising a coil assembly and track assembly, said coil assembly secured to said carriage and said track assembly positioned at a fixed relationship to said spar.

23. An imaging system, as set forth in claim 13, wherein said motion control system includes a controller, a servo circuit and a servo amplifier circuit electrically to provide said drive signals to said carriage drive means in response to said motion control algorithm.

24. An imaging system, as set forth in claim 23, wherein said motion control system includes a linear encoder for providing feedback signals indicative of the position of said carriage along said spar to said controller and said servo circuit.

25. An imaging system, as set forth in claim 13, wherein said engagement means includes a plurality of magnetic means secured in a pattern to said guide surfaces of said carriage.

26. An imaging system, as set forth in claim 25, wherein said magnetic means disposed in the orthogonal walls of said carriage for coupling said mount to said carriage comprises permanent magnets formed of rare earth material.

27. A method for focusing and establishing a diameter of an optical beam through a beam expander mechanism coupled to a spar of an imaging system, the beam expander mechanism including a carriage coupled to said spar and a lens secured within a lens mount movably coupled to said carriage, said method comprising the steps of:

(a) moving said carriage to an initial position on said spar;

(b) decoupling said lens mount from said carriage;

(c) moving said lens mount to an initial position on said carriage;

(d) fixing said lens mount in a position relative to said spar;

(e) moving said carriage a predetermined distance along said spar;

(f) coupling said lens to said carriage; and (g) releasing said lens mount.

28. A method for establishing the diameter of an optical beam, as set forth in claim 27, further comprising the steps of repeating steps (a)–(g) for a second lens secured within a lens mount movably coupled to said carriage.

29. A method for focusing and establishing a diameter of an optical beam through a beam expander mechanism coupled to a spar of an imaging system, said beam expander mechanism including a carriage coupled to said spar, a lens secured within a lens mount, and a magnetically coupled air bearing system for movably coupling said lens mount to said carriage, said method comprising the steps of:

(a) moving said carriage to an initial position on said spar;

(b) actuating said air bearing system for enabling movement of said lens mount;

(c) moving said lens mount to an initial position on said carriage;

(d) fixing said lens mount in a position relative to said spar;

(e) moving said carriage a predetermined distance;

(f) deactuating said air bearing system to magnetically couple said lens mount to said carriage; and (g) releasing said lens mount.

30. A method for establishing a diameter of an optical beam, as set forth in claim 29, further comprising the steps of repeating steps (a)–(g) for a second lens secured within a lens mount movably coupled to said carriage.

* * * * *

UNITED STATES PATENT AND TRADEMARK OFFICE
CERTIFICATE OF CORRECTION

PATENT NO. : 5,828,501
DATED : October 27, 1998
INVENTOR(S) : Alan W. Menard, David P. Squires,
Gene D. Welti and Joseph A. Wheeler It is certified that error appears in the above-indentified patent and that said Letters Patent is hereby corrected as shown below:

On the title page, item:

[73] Assignee: Please correct the name of the Assignee from "BARCO GERBER SYSTEMS" to --GERBER SYSTEMS CORPORATION--.

Signed and Sealed this

Twenty-sixth Day of October, 1999

*Attest:*

Q. TODD DICKINSON

*Attesting Officer*     Acting Commissioner of Patents and Trademarks